United States Patent [19]

Linderman

[11] Patent Number: 5,432,681
[45] Date of Patent: Jul. 11, 1995

[54] DENSITY IMPROVEMENT FOR PLANAR HYBRID WAFER SCALE INTEGRATION

[75] Inventor: Richard W. Linderman, Rome, N.Y.

[73] Assignee: The United States of America as represented by the Secretary of the Air Force, Washington, D.C.

[21] Appl. No.: 58,691

[22] Filed: Apr. 30, 1993

[51] Int. Cl.⁶ .................................. H01R 23/68
[52] U.S. Cl. ........................ 361/790; 361/761; 361/784; 361/792; 174/52.1; 174/255; 257/686; 257/700; 437/208
[58] Field of Search ............... 361/393, 394, 396, 412, 361/413, 414, 401, 417, 420, 729, 730, 731, 735, 744, 761, 784, 785, 790–793; 174/52.1, 255, 261; 437/208, 51, 915, 200, 685, 686; 257/697, 700, 777; 439/68, 70, 55

[56] References Cited

U.S. PATENT DOCUMENTS

| | | | |
|---|---|---|---|
| 4,525,921 | 7/1985 | Carson et al. | 29/577 C |
| 4,617,160 | 10/1986 | Belanger et al. | 264/40.1 |
| 4,706,166 | 11/1987 | Go | 361/403 |
| 4,877,752 | 10/1989 | Robinson | 437/51 |
| 4,953,005 | 8/1990 | Carlson et al. | 357/80 |
| 4,984,358 | 1/1991 | Nelson | 29/830 |

Primary Examiner—Leo P. Picard
Assistant Examiner—Young Whang
Attorney, Agent, or Firm—William G. Auton; Jacob N. Erlich

[57] ABSTRACT

Chip-like stacks of thinned chips are mounted in wells etched into a substrate. A "chip-like" stack is a stack of chips, which in the aggregate have a height approximately equal to that of a single conventional chip. These chip-like stacks are mounted in a variety of packages. In a preferred embodiment, the stacks are mounted in wells within the substrate of an integrated circuit and the stack is provided with a patterned overlay so that all the circuit connections can be made from the upper surface of the stack. The patterned overlay is protected by a planar insulator. A plurality of substrates may be stacked, one upon the other.

11 Claims, 1 Drawing Sheet

DENSITY IMPROVEMENT FOR PLANAR HYBRID WAFER SCALE INTEGRATION

STATEMENT OF GOVERNMENT INTEREST

The invention described herein may be manufactured and used by or for the Government for governmental purposes without the payment of any royalty thereon.

This invention improves the density achievable in a patterned overlay hybrid wafer scale integration (HWSI) module by a factor of four to sixteen by replacing the individual die with chip-like stacks of four or more thinned die. While hybrid wafer scale integration allows chip die to be placed edge to edge, it does not effectively exploit the third dimension, chip stacking. The most immediate and significant application of this invention will be to stack die four to eight deep and package them where single chips currently reside. The invention will find significant utility in replacing memory die, since memory die tend to dominate the total die count. However, the invention can also be used to stack processors on top of each other, e.g., a processor and its self checking pair (watchdog) processor. The invention can further be generalized to stack arbitrary chips of different sizes, since the flexibility of the pattered overlay can interconnect voids created by the different chip sizes.

BACKGROUND OF THE INVENTION

This invention was conceived because of a pressing need to package memory die more compactly to support the development of a wafer scale vector processor (WSVP). Each element in the WSVP being developed required 16 memory die and two processor die. If a conventional two dimensional HWSI were used in the processor, the element would require an area of about 2"×2", of which about 16/19 would be occupied by memory die. This would result in interconnects as long as 4" unacceptably slowing down the memory to the CPU interface. The objective is to place at least 4 of the processor elements into the 2"×2" area, not just one.

The "sugar cube" memories of the type developed by Irvine Sensors Corporation and described in U.S. Pat. Nos. 4,525,921 issued to Carson et al, and 4,617,160 issued to Belanger et al, is a system of stacked memories mounted on top of the HWSI substrate. This approach saves area, but uses the height dimension, in a sub-optimal manner, wasting most of its capacity by introducing a "skyline" effect. Because of the "skyline" effect, this arrangement inhibits the stacking of HWSI modules directly on top of each other.

While the prior art can stack chips atop the substrate, this invention uses a patterned overlay HWSI, and places the chips into wells custom etched into the substrate and then interconnects the chips with planarized (flat) film placed over the top of all the chips. These are then placed into the HWSI substrate, providing the desired density while preserving surface planarity. This allows the substrates to be stacked, an advantage lost if memory cubes are mounted on top of the substrate. This invention makes the stacked die so that their total thickness approaches that of a conventional chip. Hence, these chip-like stacks preserve substrate planarity which allows heat to be removed more efficiently from a stack of substrates since there are no air gaps in between layers.

Chip thinning down to 2 mils has been accomplished in the prior art. With an 80 mil substrate, 16 layer stacks of 4 mil die thick can be produced with methods well within the skill of the art. To demonstrate the technology, however, the invention was reduced to practice and is shown herein as using four 10 mil thick die.

OTHER PRIOR ART

The patents described below were found in a search of the prior art:

The Go et al U.S. Pat. No. 5,104,820 describes a method of fabricating electronic circuitry containing stacked IC layers. Chip-containing silicon wafers are modified to create IC chips having second level metal conductors on top of passivation. The metal of the second level conductors is different from the metallization included in the IC circuitry. The modified chips are cut from the wafers and stacked to form multi-layer IC devices. After stacking, a selective etching step removes any material which might interfere with the metallization formed on the access plane. Metal terminal pads are formed in contact with the terminals of the second level conductors on the stacked chips.

The Nelson U.S. Pat. No. 4,984,358 is directed to a method of assembling stacks of integrated circuit dies in which holes are made through a wafer having a plurality of integrated circuit dies. The dies includes bonding pads thereon connected to the integrated circuits in the dies. Holes are placed between the dies and adjacent the pads, and a layer of insulating material is placed over the wafer and in the outer periphery of the holes. An electrically conductive connection is patterned between the top of each bonding pad and the inside of the insulating material in an adjacent hole. The dies are then separated from each other and can be assembled in a stack.

The Carlson et al U.S. Pat. No. 4,953,005 describes a packaging system for stacking integrated circuits in which integrated circuit dies are mounted to the interconnection leads on frame of tape automatic bonding (TAB) film. Each frame of the TAB film with the attached integrated circuit die is affixed to an electrically insulating, thermally conductive plate to form a sandwich structure. A number of such sandwich structures are bonded together to form a stack of sandwiches. The interconnection leads of each sandwich in the stack are selectively electrically connected to the interconnection leads of other sandwiches in the stack to form a system of electrically interconnected integrated circuits.

The Robinson U.S. Pat. No. 4,877,752 is directed to the three dimensional packaging of focal plane signal processing electronics. Silicon dies are stacked together vertically and bonded to form an assembly. A gold ribbon lead is bonded to the face of each die and is used to provide a means for conductive connection to the next module assembly.

Although the foregoing patents relate to methods of assembling and packaging stacked electronic circuitry, they do not describe a method where a chip-like stack module is mounted in a well below the planar surface of the substrate, and where connections to all of the die in the stack are made from connections on the top of the stack.

SUMMARY OF THE INVENTION

In summary, this invention improves sugar cube chip technology by producing chip-like stacks of thinned die which can be packaged in lieu of individual die. By "chip-like" stacks, is meant a stack of chips, which in the aggregate have a height equal to that of a single conventional chip. These chip-like stacks can be mounted in a variety of packages. In a preferred embodiment, the stacks are mounted in wells within the substrate of an integrated circuit and the stack is provided with a patterned overlay so that all the circuit connections can be made from the upper surface of the stack.

BRIEF DESCRIPTION OF THE DRAWINGS

For a better understanding of the nature and purposes of this invention, reference should now be made the following detailed specification and to the accompanying drawings, in which.

DESCRIPTION OF THE PREFERRED EMBODIMENTS

Figure 1:
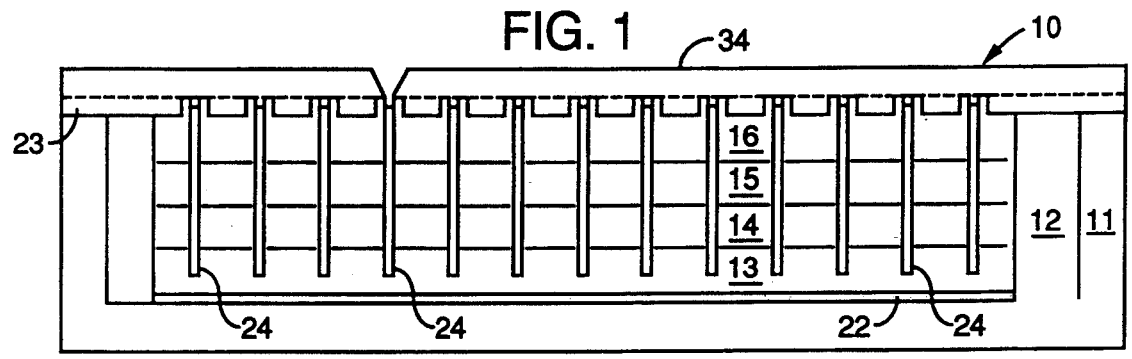
FIG. 1 is a diagrammatic cross section of a preferred embodiment of a hybrid wafer scale integration module in accordance with this invention.

Referring to the drawings, a hybrid wafer scale integration module 10 comprises an alumina or aluminum nitride or silicon substrate 11 into which a well 12 is etched or machined. A plurality of very thin die or chips 13, 14, 15 and 16 are mounted in a chip-like stack 20, and bonded to the substrate by means of a suitable bonding material 22. While it is contemplated that a plurality of wells 12 may be made in a substrate to accommodate a like plurality of stacks, only one such well is shown in FIG. 1. The stacks 20 are referred to as "chip-like" because the stack comprises very thin die, so that the height of the stack is approximately that of a conventional single chip.

Figure 2:
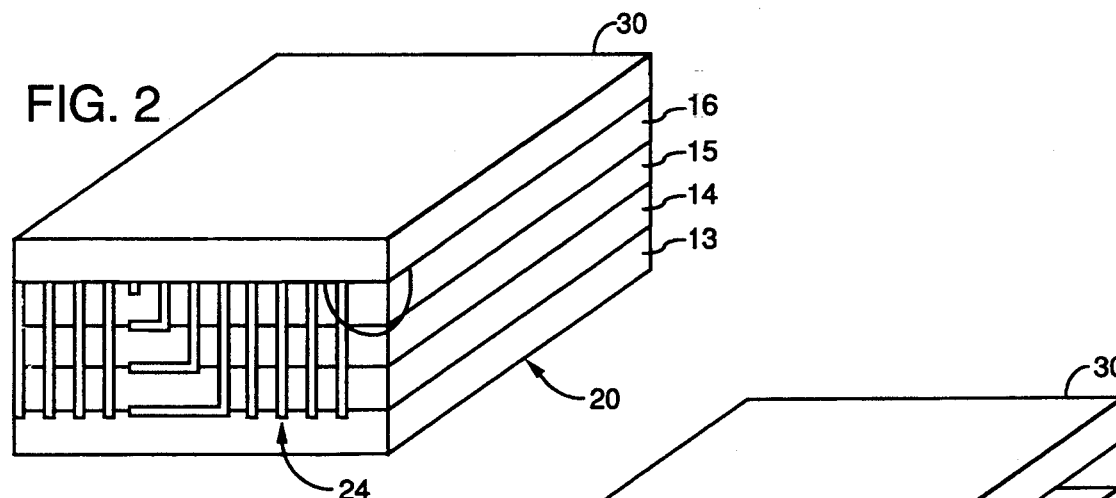
FIG. 2 is a three dimensional view of a single chip like stack made in accordance with this invention.
Figure 3:
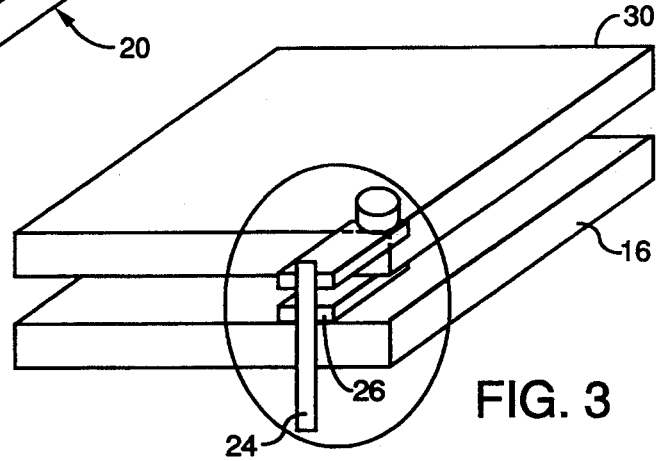
FIG. 3 is an enlarged view (not to scale) showing a detail of the invention circled in FIG. 2.

A patterned overlay 23 is placed on the upper surface of the substrate 10, and connections to the overlay are provided by electrical connections which, as best seen in FIGS. 2 and 3, comprise a plurality of vertical bus lines 24 mounted on a side of the stack 24 which are connected to the individual chip circuitry by means of metallizations 26, and 27. Connections to the each chip are made through a metal pad 28 extending through a cap chip 30 on the surface of the stack 20. With this arrangement, connections can be made to each of the chips in the stack. As seem in FIG. 1, the overlay 30 is covered with a planar layer 34 of insulation such as Kapton (TOM.).

Figure 4:
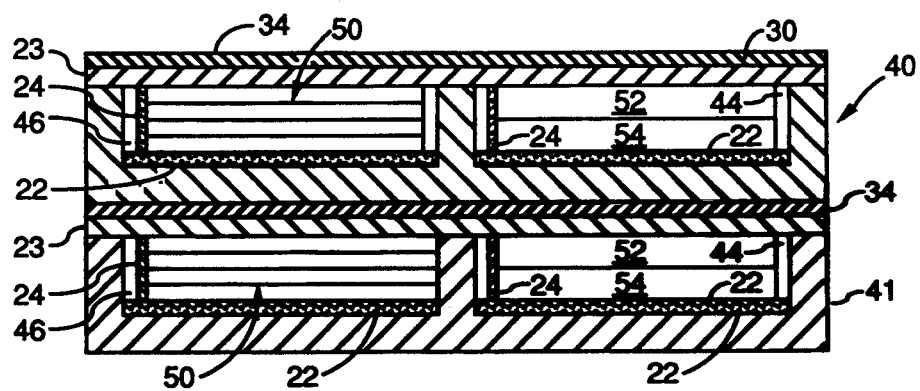
FIG. 4 is a view of a particular application showing stacked substrate containing a plurality of chip-like stacks.

The construction of a module 40, shown in FIG. 4, is basically the same as that of the module 10 shown in FIG. 1, except the module 40 is shown with a substrate 42 which has 2 wells 44 and 46. A stack of chips 50 is placed in the well 46, while two chips 52 and 52 are placed in the well 44. Other chip arrangements are contemplated as well, and the particular arrangements are only by way of example. In addition, the embodiment of FIG. 4 illustrates a second module 41 on which the module 40 is stacked. While the modules 40 and 41 are illustrated as identical, they may have different arrangements of wells and chips. Moreover, it should be recognized, that the number of wells in each module is limited only by the area of the substrate, and in a practical case three or more wells may be incorporated. In addition, while only two modules are illustrated in the module stack, it is to be understood that the number of stacked modules is limited only by the needs and space requirements of the system.

In this embodiment, the stack 50 is a stack of memory chips, while the chips 52 and 54 are a processor and the watchdog, respectively. All of the chips are bonded to their respective substrates by means of a bonding material 22.

The vertical interconnects 24 shown in FIGS. 1-3 are applicable to the arrangement of FIG. 4, and although not shown, the arrangement of FIG. 4 also utilizes the horizontally, over the top of the stack connectors 25. As in FIGS. 1-3, the top surfaces are provided with a cap chip 23 which is insulated by an insulating layer 34 between each of the stacked modules.

A soon to be published article by the inventor and Ralph K. Kohler, Jr., included in the Disclosure Information Statement filed with this application, and incorporated herein by reference, shows proposed architectures for one Wafer Scale Vector Processor (WSVP) which is a flexible, high performance, multi-element super-scalar vector processor being developed by the United States Air Force Rome Griffiss AFB Laboratory and the Air Force Institute of Technology. By employing stacked hybrid wafer scale integration, the processor described in the article achieves very low size, weight and power requirements, while the super-scalar vector architecture sustains high throughput on important signal processing problems. Since the basic element of the WSVP requires only about one square inch of area within a hybrid wafer substrate, a wide variety of multi-element WSVP architectures can be considered for any particular application.

Clearly, many modifications and variations of the present invention are possible in light of the above teachings and it is therefore understood, that within the inventive scope of the inventive concept, the invention may be practiced otherwise than specifically claimed.

What is claimed is:

1. A hybrid wafer scale integration module comprising:
   a substrate having a horizontal planar surface;
   a plurality of thinned wafers, each of said wafers having a planar surface, said wafers having electric circuits printed on said planar surfaces and said wafers being mounted directly one upon the other in a stack;
   a well in said substrate, said well being formed through said horizontal planar surface and having a depth at least equal to the height of said stack, said stack of wafers being positioned within said well; and
   a plurality of connectors vertically positioned on a side of said stack, and extending over the top thereof, said connectors providing electrical connections from the top planar surface of said stack to said electric circuits on each of said wafers.

2. The module of claim 2, and patterned overlay on said planar surface, said overlay providing access to said connectors and said electric circuits.

3. The module of claim 3, and a planar insulator on the surface of said patterned overlay for insulating said patterned overlay.

4. The module of claim 3, and a second similar module mounted on said planar surface insulator.

5. The module of claim 1, and an additional well in said substrate, and a second wafer positioned in said second well.

6. A hybrid wafer scale integration system comprising at least first and second modules each of said modules comprising:
- a substrate having a horizontal planar surface;
- a plurality of thinned wafers having a planar surface, said wafers having electric circuits printed on said planar surfaces and being mounted one upon the other in a stack;
- a well in said substrate, said well being formed through said horizontal planar surface and having a depth at least equal to the height of said stack, said stack of wafers being positioned within said well; and
- a plurality of connectors vertically positioned on a side of said stack, and extending over the top thereof, said connectors providing electrical connections from the top planar surface of said stack to said electric circuits on each of said wafers.

7. The system of claim 6, and a patterned overlay on each planar surface, said overlay proving access to said connectors and said circuit connections.

8. The combination comprising:
- a substrate having a planar surface;
- a plurality of flat thinned wafers arranged in a stack;
- a well formed in said substrate, said well having a depth at least equal to the height of said stack; and
- said stack being bonded to said substrate within said well; and
- a plurality of connectors on the side of said stack and extending over the top surface thereof.

9. The combination of claim 8, and a patterned overlay on each planar surface, said overlay proving access to said connectors and said circuit connections.

10. The combination of claim 9, and an insulator on said patterned overlay.

11. The combination of claim 10, wherein there are a plurality of wells in said substrates, and at least one wafer in each well.

* * * * *